(12) United States Patent
Nirschl et al.

(10) Patent No.: US 9,343,179 B2
(45) Date of Patent: May 17, 2016

(54) WORD LINE ADDRESS SCAN

(71) Applicant: Infineon Technologies AG, Neubiberg (DE)

(72) Inventors: Thomas Nirschl, Putzbrunn (DE); Jens Rosenbusch, Munich (DE); Ulrich Backhausen, Taufkirchen (DE); Thomas Kern, Munich (DE); Thomas Liebermann, Munich (DE)

(73) Assignee: Infineon Technologies AG, Neubiberg (DE)

( * ) Notice: Subject to any disclaimer, the term of this patent is extended or adjusted under 35 U.S.C. 154(b) by 197 days.

(21) Appl. No.: 14/132,053

(22) Filed: Dec. 18, 2013

(65) Prior Publication Data

US 2015/0170762 A1    Jun. 18, 2015

(51) Int. Cl.
*G11C 29/00* (2006.01)
*G11C 29/02* (2006.01)
*G06F 11/10* (2006.01)

(52) U.S. Cl.
CPC .......... *G11C 29/024* (2013.01); *G06F 11/1076* (2013.01)

(58) Field of Classification Search
CPC .......................... G11C 29/024; G06F 11/1076
See application file for complete search history.

(56) References Cited

U.S. PATENT DOCUMENTS 5,768,193 A * 6/1998 Lee ................. H01L 27/115
257/E27.103
6,275,442 B1 * 8/2001 Hill ........................ G11C 8/08
365/189.05

\* cited by examiner

*Primary Examiner* — Sam Rizk
(74) *Attorney, Agent, or Firm* — Eschweiler & Associates, LLC (57) ABSTRACT

A system and method for performing three scans for testing an address decoder and word line drive circuits is disclosed. The first scan determines whether only one word line is selected. The second scan determines whether the word line rise time to a target voltage level is within a specified time. Finally, the third scan determines whether the correct word line was selected.

20 Claims, 6 Drawing Sheets

WORD LINE ADDRESS SCAN

FIELD

The present disclosure relates to methods and systems for address decoder and word line driver verification in memories. More specifically, the disclosure relates to methods and systems for providing high reliability addresses to data out paths.

BACKGROUND

Memories, such as static random access memories (SRAMs), dynamic random access memories (DRAMs) and nonvolatile memories (NVM) typically comprise a plurality of memory cells that are capable of storing a charge representing a data bit. These memory cells are often arranged in an array of intersecting rows and columns. Conventionally, the lines running adjacent to each row of memory cells are called word lines, and the lines running adjacent to each column of memory cells are called bit lines. By selectively applying activation voltages to these word lines and bit lines, the memory cells can be accessed. In general, word lines activate memory cells and bit lines provide data to or retrieve data from the activated memory cells.

A read or write function to a memory cell is performed by applying an activation voltage to the word line by a word line driver. When an activation voltage is applied to the word line, specific circuitry in the memory cell is activated that enables a bit line to write data to or retrieve data from the activated memory cell. Typically, a word line driver applies a positive voltage level to the word line to activate the word line.

Figure 1:
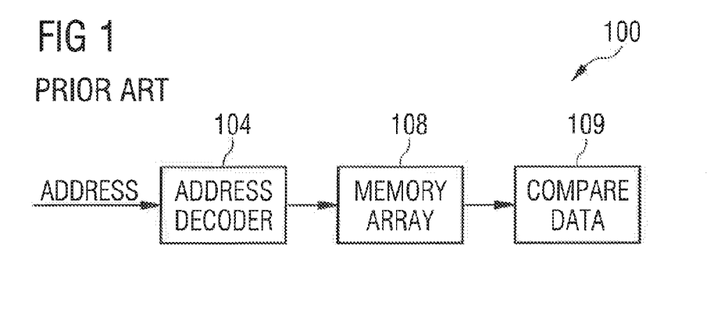
FIG. 1 shows a high level block diagram of a conventional word line address scan found in the prior art.

FIG. 1 shows a high level diagram of a conventional word line address scan system 100. A conventional address scan may comprise an address decoder 104 for receiving an address, a memory array 108 for storing data corresponding to the address and a compare data module 109 for comparing the data read from the memory array 108 which is a function of the input address with the expected data.

Conventional word line address scan systems have several disadvantages. For example, the voltage levels between the memory array and those of the address decoder may vary significantly depending on the memory technology. This is especially true for certain non-volatile memories like Flash which use transistors with floating gates that are driven by higher voltages. Often additional circuitry is necessary to up-shift the voltages to drive the word line to a higher voltage. Thus, the testing of certain memory addressing and word line driving circuitries may be difficult due to the voltage mismatch involved.

Additionally, conventional word line address scan systems do not test, either individually or in combination, whether a word line of memory cells is correctly selected, whether a word line voltage rises to a target voltage within a specified short time frame, and that no other word line is selected at the same time. It would be desirable to have a word line address scan system that allows testing of only one or a combination of two or three of these testing parameters.

A further disadvantage of conventional word line address scan systems is the lack of fast "disaster checks" for the above listed testing parameters which can be implemented at low cost and high speed and may also be used permanently during system operation without disturbing the current system. This is especially important for safety applications. For example, it would be desirable to have a word line address scan that tests whether a single word line is selected, and not two or more, in a safety application for quick checks without the need to involve the whole address encoding and decoding circuitry.

Conventional word line address scan systems are inadequate to address these disadvantages without significantly increasing costs and complexity. Therefore, there exists a need for a word line address scan system and method which provides several tests of a word line addressing circuitry of a flash memory including whether only one word line is selected, whether the correct word line is selected, and whether the word line voltage rises within a given time frame. Moreover, there is a need for a system that allows only one or a combination of these tests, especially as a disaster check during safety applications.

SUMMARY

The present disclosure provides a system and method for testing whether only one word line is selected in a given memory array, whether the correct word line was selected, and whether the word line rise time to a targeted voltage level is within a specified time frame. The present disclosure may test only one of these parameters or a combination of two or three of them.

More specifically, in accordance with one aspect of the disclosure, a system for performing a word line address scan comprises an address decoder configured to receive and decoding an address associated with a memory array and a word line address scan for detecting the switching of one or several decoder outputs without the need to test the decoding itself. In one embodiment, the word line address scan comprises a wired OR circuit coupled to the output of the address decoder that detects the switching of one or more decoder outputs. In one embodiment the bias of the wired OR circuit may be adjusted to detect the selection of either one word line or two or more word lines. In one embodiment, the word line address scan system may be a low voltage scan configured to detect fails in the address decoder before the word line signal enters the memory array. In another embodiment, the word line address scan system may be a high voltage word line address scan coupled to the output of the word line driver and to the inputs of the memory array configured to detect fails either in the address decoder or in the word line driver before the word line signal enters the memory array. In yet another embodiment, the word line address scan may be a high voltage word line address scan coupled to the end of the word line in the memory configured to detect fails in the address decoder, in the word line driver, or within the word line in the memory array.

The word line address scan system may further comprise a timing verification circuit coupled to the output of a Wired OR circuit configured to vary the timing of the system and determine whether the end of the word line is brought up within a certain amount of time, and a pre-address decoder coupled to the input of the address decoder configured to enable address transition detection. The system may also comprise an encoder coupled to the output of the system and a compare circuit coupled to the input of the address decoder and the output of the encoder configured to allow the separation of address failure detection and data failure detection and correction.

Further features, aspects and advantages of the present disclosure will become apparent from the following detailed description of the disclosure made with reference to the accompanying drawings.

BRIEF DESCRIPTION OF THE DRAWINGS

The accompanying drawings are included to provide a further understanding of the present disclosure and are incorporated in and constitute a part of this specification. The drawings illustrate embodiments of the present disclosure and together with the description serve to explain the principles of the disclosure. Other embodiments of the present disclosure and many of the intended advantages of the present disclosure will be readily appreciated as they become better understood by reference to the following detailed description.

DETAILED DESCRIPTION

In the following detailed description, reference is made to the accompanying drawings, which form a part hereof, and in which is shown by way of illustration specific embodiments in which the disclosure may be practiced. It is to be understood that other embodiments may be utilized and structural or other changes may be made without departing from the scope of the present disclosure. Therefore, the following detailed description is not to be taken in a limiting sense, and the scope of the present disclosure is defined by the appended claims.

Figure 2A:
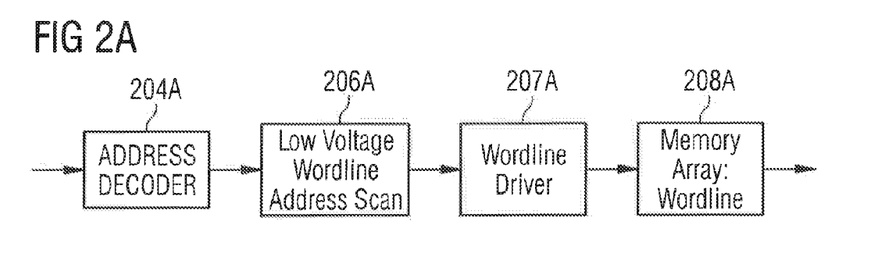
FIGS. 2A-2C show high level diagrams of a word line address scan system 200 in accordance with one embodiment of the present disclosure.
Figure 2B:
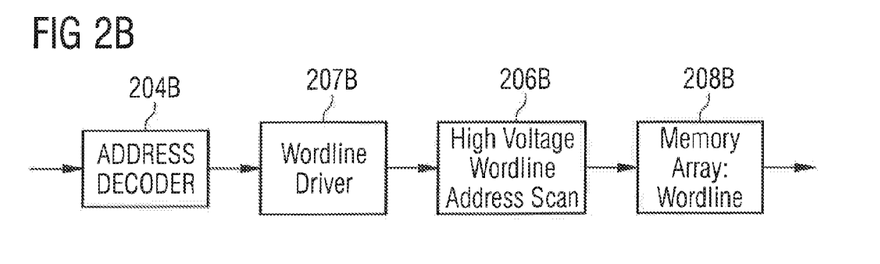
Figure 2C:
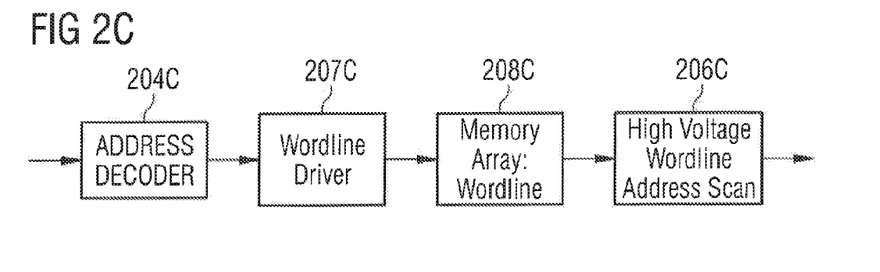

FIGS. 2A, 2B and 2C show high level diagrams of a word line address scan system in accordance with three embodiments of the present disclosure. In these embodiments, the word line address scan systems 200 comprise an address decoder 204, a wordline address scan 206, a word line driver 207, and a memory array 208. The address decoder 204 may be a conventional standard address decoder coupled to a specific subset of 2× address lines (e.g. a0, a0#, a1, a1#, a2, a2# . . . an, an#) where a specific subset of these address lines being at a logic "high" level defines the address.

In the first embodiment shown in FIG. 2A, the word line address scan 206A may be a low voltage word line scan coupled to the output of the address decoder 204A and to the input of the word line driver 207A and memory array 208A, and configured to detect fails in the address decoder 204A before the word line signal enters the memory array 208A. This low voltage word line scan 206A may operate in either a "word line" mode or a "sector" mode.

Alternatively, in the second embodiment shown in FIG. 2B, the word line address scan 206B may be a high voltage word line address scan coupled to the output of the word line driver 207B and to the inputs of the memory array 208B, and configured to detect fails either in the address decoder 204B or in the word line driver 207B before the word line signal enters the memory array 208. The high voltage word line address scan 206 may operate in either a "word line" mode or a "sector" mode.

In a third embodiment, the word line address scan 206C is a high voltage word line address scan coupled to the end of the word line in the memory array 208C, and configured to detect fails in the address decoder 204C, in the word line driver 207C or within the word line in the memory array 208C.

Figure 3:
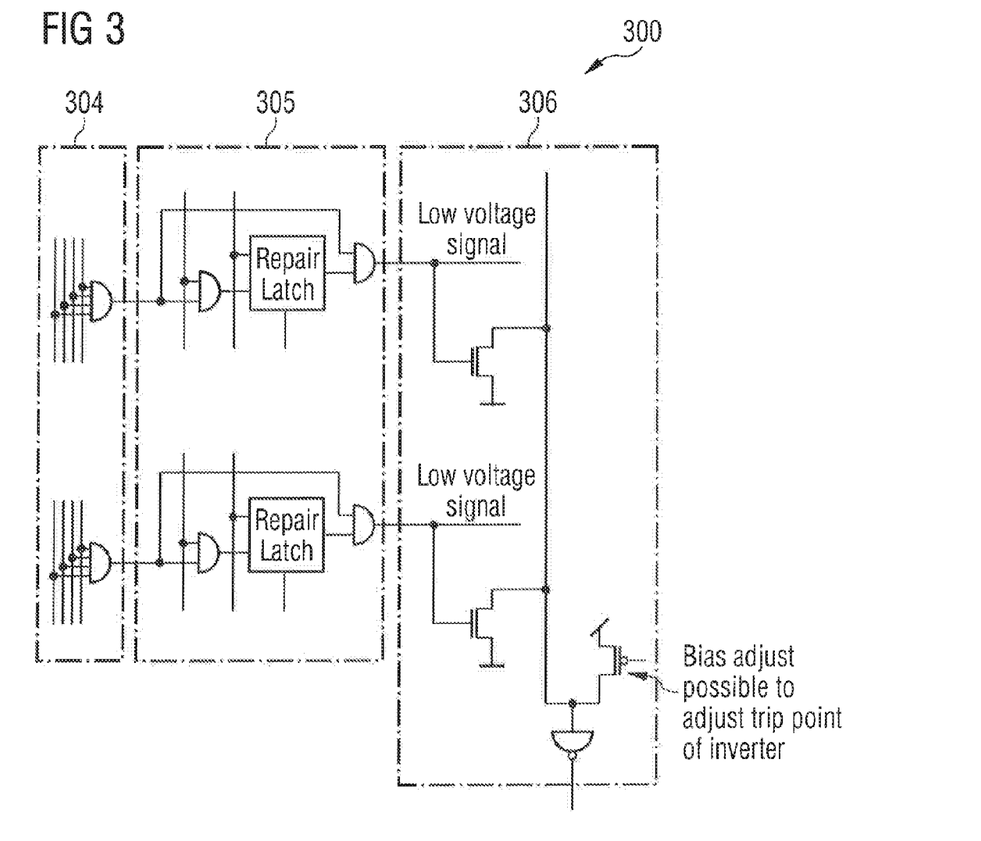
FIG. 3 shows an example schematic diagram of a word line address scan system 300 in accordance with one embodiment of the present disclosure.

FIG. 3 shows an example schematic diagram of a word line address scan system in accordance with one embodiment of the present disclosure. The word line address scan system 300 comprises an address decoder 304, a redundancy selection circuit 305 and a low voltage word line address scan 306. The address decoder 304 may be a conventional standard address decoder and may be either a "word line" decoder or a "sector" decoder. The redundancy selection circuit 305 coupled to the output of the address decoder 304 may be used for selecting, deselecting or programming redundancy information for the memory array. For example, the circuit 305 may mask a word line selection (e.g. if a word line is broken and should not be used) or select a redundant word line.

In one embodiment of the present disclosure, the low voltage word line address scan 306 may comprise a "Wired-OR" circuit coupled to the output of the redundancy selection circuit 305, and configured to detect the switching of one or more decoder outputs. In another embodiment, the Wired-OR circuit 306 may be coupled to the output of the address decoder 304.

In one embodiment, the voltage bias of the PMOS transistor of the "wired OR" 306 may be set such that one NMOS transistor is sufficient to pull down the entire line below the switching point of the inverter thus allowing detection that at least one word line has been selected. In another embodiment, the bias current of the PMOS transistors may be adjusted to vary its resistance to require two or more NMOS transistors to pull down the entire line below the switching point of the inverter. With this embodiment, the present disclosure easily detects an error where two or more word lines are selected. Thus, by detecting the switching of one or several decoder outputs and detecting whether two or more word lines have been selected, the present disclosure advantageously provides a more efficient mechanism for testing the word lines address and saves time by avoiding the need to read through the memory array and checking the output. Rather, the present disclosure scans the sector or word line addresses and checks whether only one or several word lines have been selected.

Furthermore, as is known in the art, a memory array usually has a hierarchy in which the memory may be divided into sectors wherein each sector contains a certain number of word lines. In one embodiment, the present disclosure may operate in a "sector" mode wherein only the sector addresses are scanned. In another embodiment, the present disclosure may operate via all word lines (e.g. 32, 64 or more).

Figure 4:
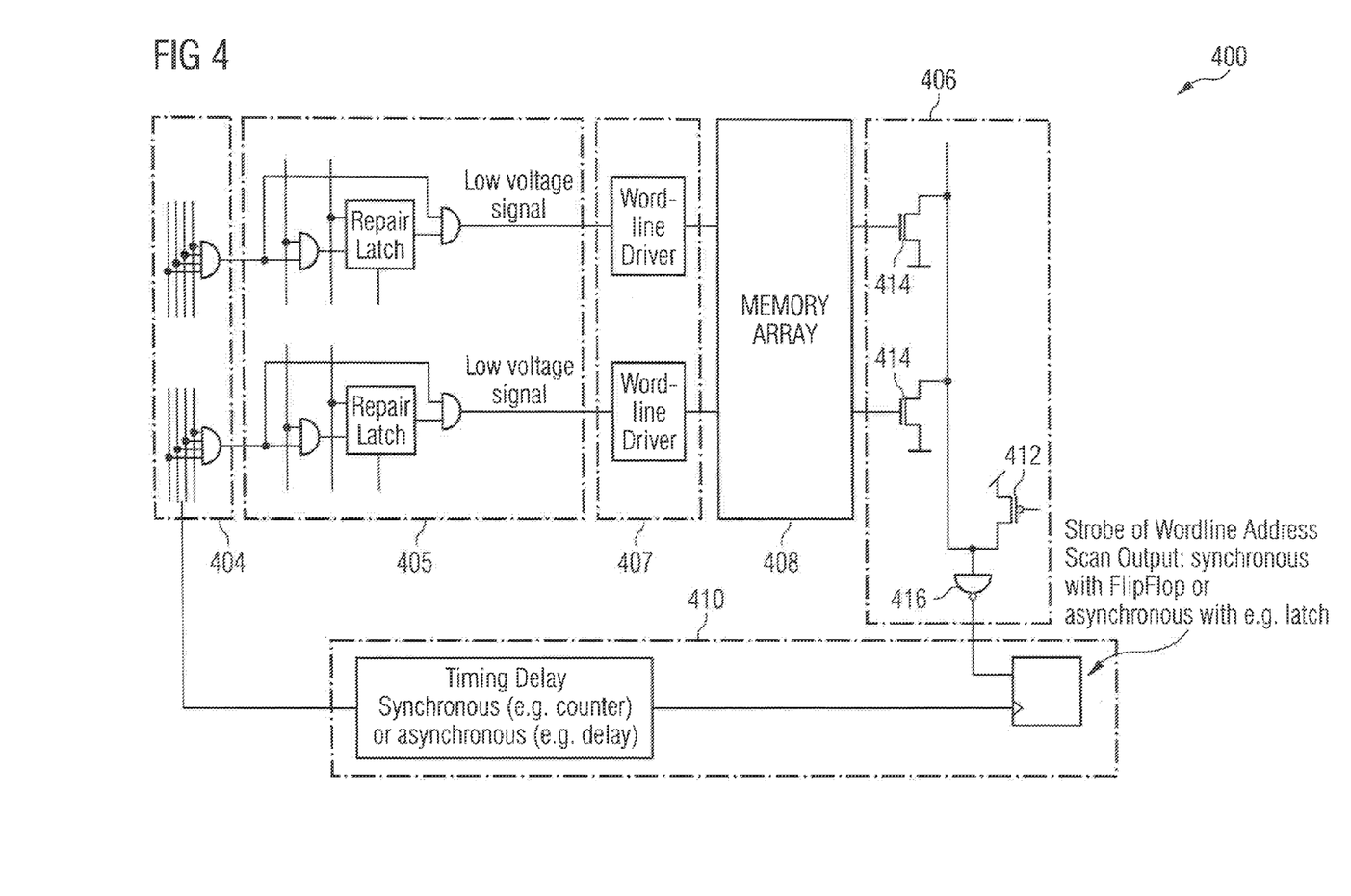
FIG. 4 shows an example schematic diagram of a word line address scan system 400 in accordance with one embodiment of the present disclosure.

FIG. 4 shows an example schematic diagram of a word line address scan system in accordance with one embodiment of the present disclosure. The word line address scan system 400 in FIG. 4 comprises an address decoder 404, a redundancy selection circuit 405, a word line driver 407, a memory array 408, a "Wired-OR" circuit 406, and a timing verification circuit 410.

In one embodiment, the word line driver 407 is a chain of inverters enabling the disclosure to drive a higher word line load. The word line driver 407 may comprise level shifters and inverters in another voltage domain in cases where a higher voltage on the word line is needed. The word line driver 407 drives the voltage of the word line signal to a voltage higher than the logic voltage domain, for example to 3.5V or 4V, before entering the memory array. In one embodiment, the "Wired-OR" circuit 406 may comprise a PMOS transistor 412 with its source connected to the logic supply voltage and an adjustable gate voltage. The drain of the PMOS transistor is connected to a couple of (high voltage) NMOS transistors 414 whose drains are all connected together (forming the "Wired-OR") and whose gates are connected to the individual word lines. The common nodes of the PMOS 412 and NMOS transistors 414 are the output of the "Wired-OR" which is being fed to a normal CMOS inverter 416. The NMOS transistors 414 can sustain the high input voltage from the word line; a single word line being selected and having a higher voltage (e.g. 4.2 V) selects one single NMOS transistor to an "ON" state and enabling a current path from logic supply via PMOS 412 and NMOS (one of 414) to ground. Depending on the bias voltage of the PMOS transistor 412, it may be sufficient to have one NMOS transistor pulling down the input of the inverter 416. In this case, there is a logic "HIGH" signal at the output of 416.

Upon detection of the word line signal entering the memory array 408 by the word line address scan 406, the timing verification circuit 410 strobes the result of the word line address scan 406 (output of inverter 416). In one embodiment, the signal leaving the word line scan 406 may be strobed by a flip flop 410. The trigger signal of the flip flop 410 may be generated by the address decoder 404 with a time delay circuit to consider the word line rise time in the memory array 408.

In another embodiment, the output of the "Wired-OR" circuit 406 is fed to a register (flip flop) 410 to register the value (as a normal operation in a synchronous design) and may also allow the present disclosure to register the output of the "Wired-OR" after a certain number of clock cycles. The enable signal of the flip flop 410 may be controlled by a counter to check different timings. Thus, by allowing the adjustment of the clock cycles, the present disclosure advantageously provides the ability to vary the timing of the system and to check whether the end of the word line is brought up within a certain amount of time.

Figure 5:
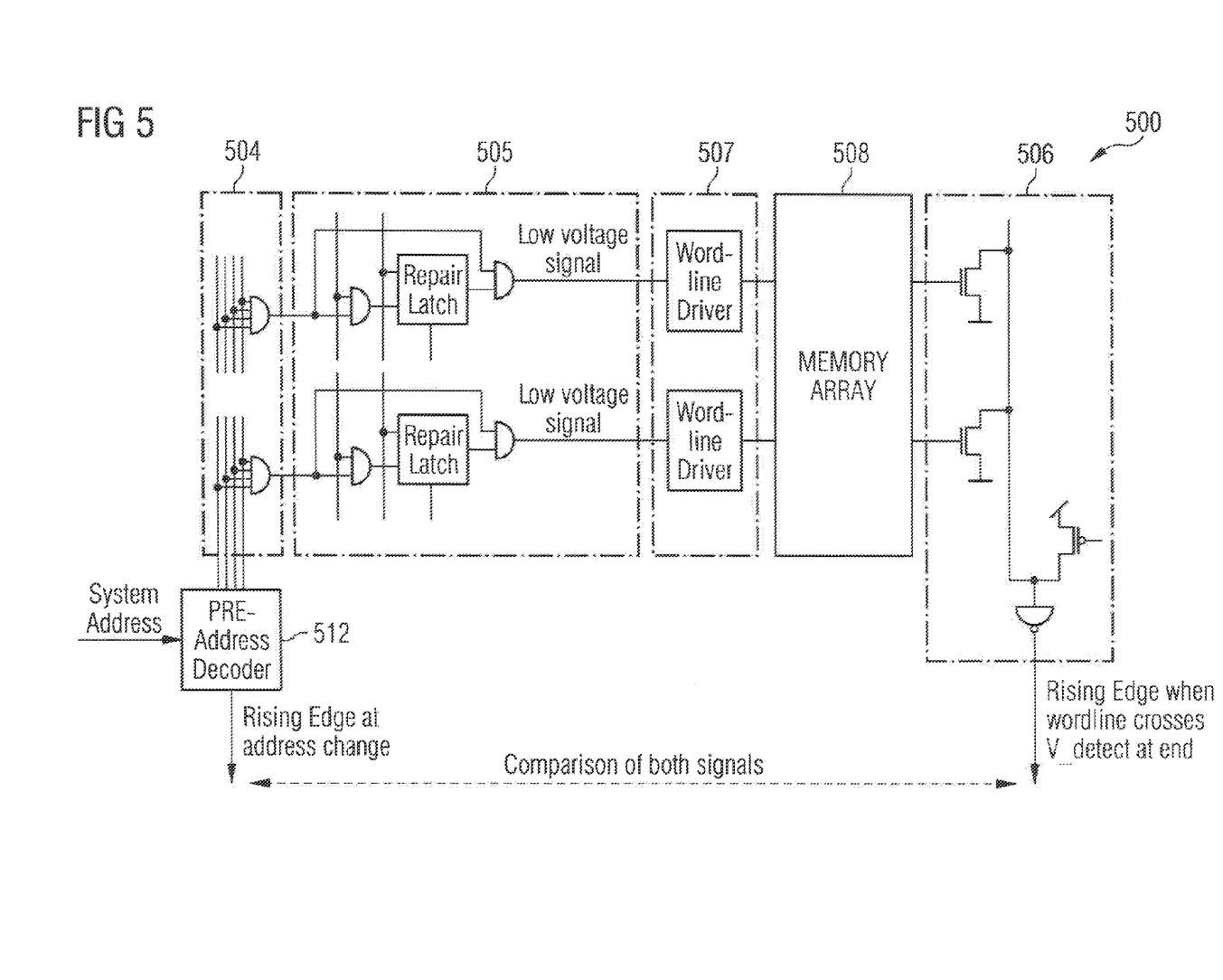
FIG. 5 is an example schematic diagram of a word line address scan system 500 in accordance with another embodiment of the present disclosure.

FIG. 5 is an example schematic diagram of a word line address scan system 500 in accordance with another embodiment of the present disclosure. The word line address scan system 500 in FIG. 5 comprises an address decoder 504, a redundancy selection circuit 505, a word line driver 507, a memory array 508, a "Wired OR" logic 506, and a system pre-address decoder 512 together with address transition detection. Address transition detection may not be necessary in case a synchronous address change signal is available.

In the embodiment of FIG. 5, the present disclosure compares the signals received from the system pre-address decoder 512 and from the "Wired-OR" 506. A rising edge is created at the output of the system pre-address decoder 512 at an address change. A rising edge is also created when the word line crosses V_detect at the end. V-detect is the voltage necessary for one NMOS transistor to pull down the word line to flip the inverter in the "Wired-OR" logic 506.

The present disclosure compares both edges by either an oscilloscope (picopads, external pads) or by digital means (e.g. trigger of timer/counter and stop of timer). The system 500 compares the rising edge at an address change with the rising edge when the word line crosses V_detect at the end to determine whether the signal from the output of the "Wired-OR" circuit 506 is high a specified amount of time after the address change. Thus, the present disclosure advantageously provides address transition detection and allows the memory array to test itself without the need for external controls.

Figure 6:
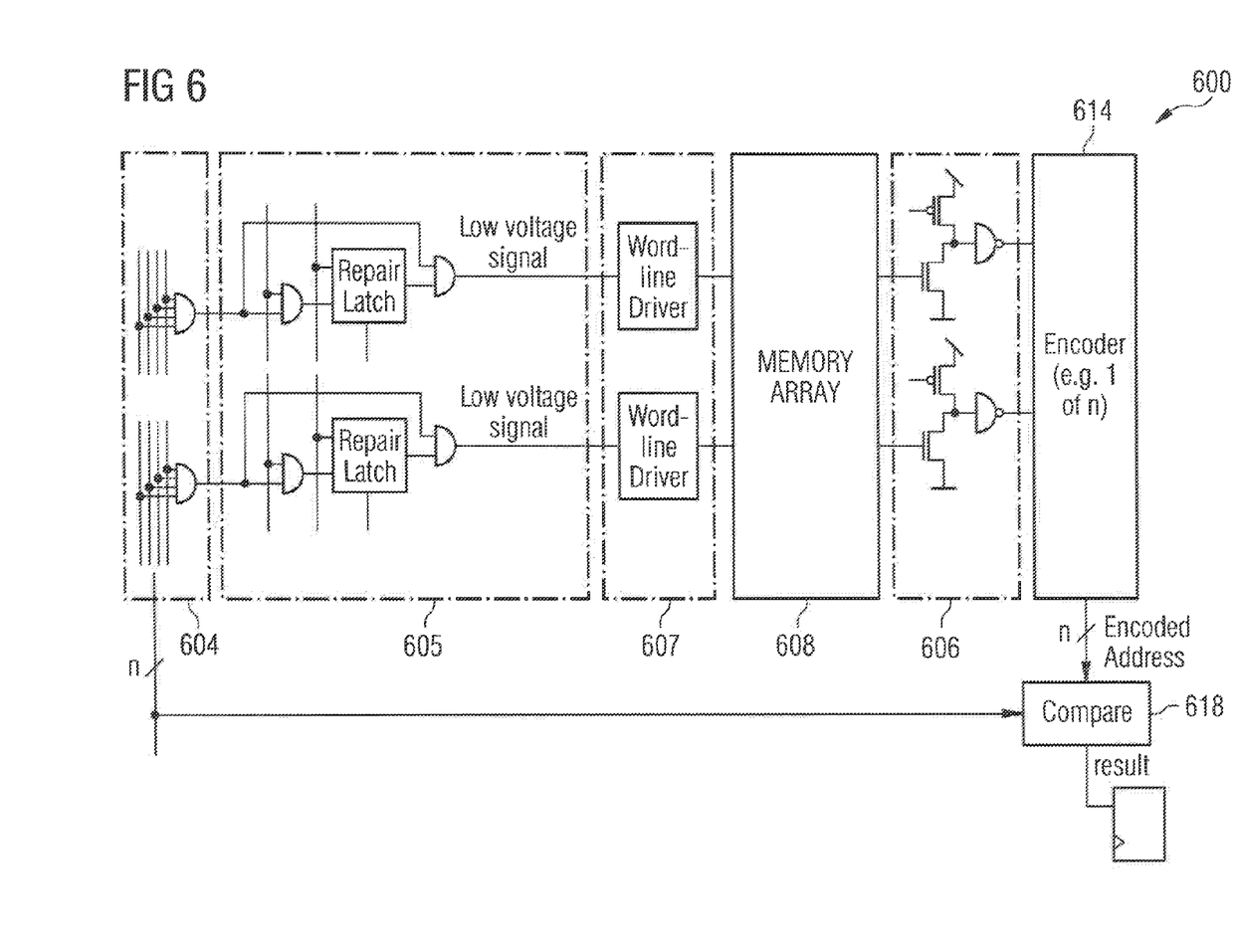
FIG. 6 is an example schematic diagram of a word line address scan system 600 in accordance with another embodiment of the present disclosure.

FIG. 6 is an example schematic diagram of a word line address scan system in accordance with another embodiment of the present disclosure. The word line address scan system 600 in FIG. 6 comprises an address decoder 604, a redundancy selection circuit 605, a word line driver 607, a memory array 608, a voltage level shifter ("down shifting") 606, an encoder 614, and a compare circuit 618. In one embodiment, the voltage level shifter 606 may be an inverter using an NMOS transistor which can sustain higher voltages on the gate. The gate of this NMOS transistor is connected to the word line voltage and this circuit can be used to convert a HIGH/LOW in a higher voltage domain to a HIGH/LOW in a lower voltage domain (e.g. for core logic devices).

In this embodiment, the output of the inverter at the end of the word line is fed into a "1 of N" encoder which encodes the address which is then compared with the original address thus allowing the separation of address failure detection and data failure detection and correction. Thus, the system in FIG. 6 enables the present disclosure to verify that the address decoders worked properly and that the correct word line is chosen.

Figure 7:
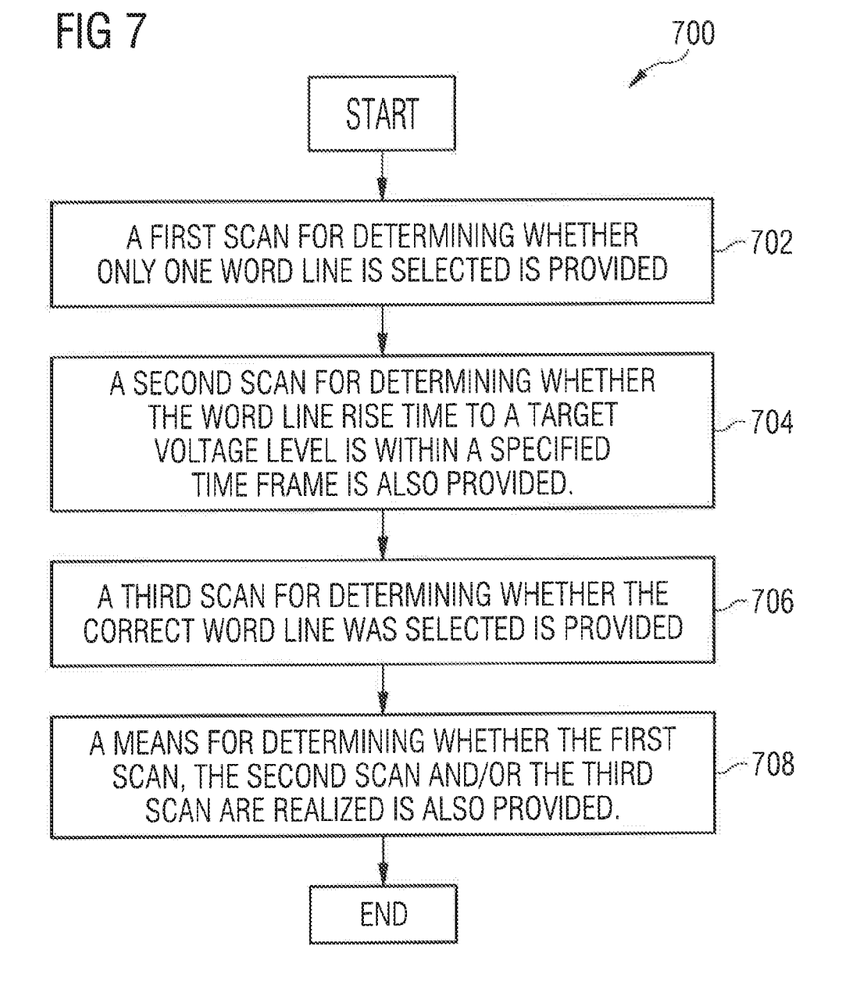
FIG. 7 is an example flow chart diagram of a method for performing a word line address scan 700 in according with one embodiment of the present disclosure.

FIG. 7 is an example block diagram of a method for a word line address scan 700 in according with one embodiment of the present disclosure. For clarity, the method 700 is described in context of the systems described in FIGS. 2 through 6. However, in alternate embodiments, other configurations may be used. Moreover, other embodiments may perform the acts described here in different orders and/or other embodiments may perform additional and/or different steps than those described here.

A first scan for determining whether only one word line is selected is provided at 702. A second scan for determining whether the word line rise time to a target voltage level is within a specified time frame is also provided at 704. A third scan for determining whether the correct word line was selected is provided at 706. In accordance with one embodiment of the present disclosure, all three scans may be tested together at 708. In another embodiment, the three scans may be tested independently at 708. In one embodiment of the present disclosure, at least one scan is implemented using a Wired OR circuitry coupled to the output of the address decoder and to the input of a word line driver. In another embodiment, at least one scan is implemented using a Wired OR circuitry coupled to the output of a word line driver and to the input of the memory array. In yet another embodiment, at least one scan is implemented using a "Wired OR" circuitry coupled to the end of the word lines in the memory array.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A word line address scan system for verifying a functionality of an address decoder for a memory array, the system comprising:
   the address decoder configured to receive and decoding an address associated with the memory array to select a word line;
   a word line address scan circuit configured to detect a switching of one or several decoder outputs without the need to test the decoding itself;
   an encoder configured to generate an address out of the selected word line; and a compare circuit configured to check whether the correct word line has been selected, based on an output of the encoder.

2. The system of claim 1, wherein the word line address scan is a low voltage scan coupled to the outputs of the address decoder configured to detect decoder fails in the address decoder before the word line signal enters the memory array.

3. The system of claim 1, wherein the word line address scan system is a high voltage word line address scan coupled to the outputs of the word line driver and to the inputs of the memory array configured to detect fails either in the address decoder or in the word line driver before the word line signal enters the memory array.

4. The system of claim 1, wherein the word line address scan system is a high voltage word line address scan coupled to an end of the word line in the memory array or coupled to the end of a sub-word line in case of a divided word line structure, and configured to detect fails in the address decoder, in the word line driver or within the word line in the memory array.

5. The system of claim 1, wherein the word line address scan further comprises a wired OR circuit coupled to the output of the address decoder configured to detect the switching of one or more decoder outputs.

6. The system of claim 5, wherein a bias of the wired OR circuit is set to detect the selection of one word line.

7. The system of claim 5, wherein a bias of the wired OR circuit is set to detect the selection of at least two word lines.

8. The system of claim 5, further comprising a delay timing generator whose trigger is connected to the address input of the memory and whose output is compared with the output of the wired OR circuit, and configured to vary the timing of the system and determine whether the end of the word line is brought up within a certain amount of time.

9. The system of claim 8, further comprising an address transition detection coupled to the input of the address decoder configured to enable an address scan test without dedicated system trigger signals.

10. A word line address scan system for detecting a switching of one or several decoder outputs to a memory array without the need to test the decoding itself, the system comprising:
a first scan circuit configured to perform a first scan to determine whether only one word line is selected;
a second scan circuit configured to perform a second scan to determine whether the word line rise time to a target voltage level is within a specified time frame; and
a third scan circuit configured to perform a third scan to determine whether the correct word line was selected;
wherein the first scan circuit, the second scan circuit and the third scan circuit are configured to perform the first scan, the second scan and the third scan independently or in various combinations.

11. The system of claim 10, wherein at least one scan circuit comprises a Wired OR circuitry coupled to the output of the address decoder and to the input of a word line driver.

12. The system of claim 10, wherein at least one scan circuit comprises a Wired OR circuitry coupled to the output of a word line driver and to the input of the memory array.

13. The system of claim 10, wherein at least one scan circuit comprises a Wired OR circuitry coupled to the end of the word line of the memory array or coupled to the end of a sub-word line in case of a divided word line architecture.

14. The system of claim 10, wherein at least one scan is implemented using a down-shifting circuitry coupled to the end of the word line of the memory array or coupled to the end of a sub-word line in case of a divided word line architecture.

15. A method for a word line address scan for detecting the switching of one or several decoder outputs to a memory array without the need to test the decoding itself, the method comprising:
providing a first scan for testing whether only one word line is selected;
providing a second scan for testing whether the word line rise time to a target voltage level is within a specified time frame;
providing a third scan for testing that the correct word line was selected.

16. The method of claim 15, wherein all three scans are tested together.

17. The method of claim 15, wherein the three scans are tested independently.

18. The method of claim 15, wherein at least one scan is implemented using a Wired OR circuitry coupled to the output of the address decoder and to the input of a word line driver.

19. The method of claim 15, wherein at least one scan is a high voltage scan and is implemented using a Wired OR circuitry coupled to the output of a word line driver and to the input of the memory array.

20. The method of claim 15, wherein at least one scan is a high voltage scan and is implemented using a Wired OR circuitry coupled to the end of the word line of the memory array or coupled to the end of a sub-word line in case of a divided word line structure.

* * * * *